(12) United States Patent
Hao

(10) Patent No.: US 12,284,824 B2
(45) Date of Patent: Apr. 22, 2025

(54) METHOD FOR MANUFACTURING METAL GATE

(71) Applicant: Shanghai Huali Integrated Circuit Corporation, Shanghai (CN)

(72) Inventor: Yanxia Hao, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 405 days.

(21) Appl. No.: 17/749,970

(22) Filed: May 20, 2022

(65) Prior Publication Data

US 2022/0384615 A1 Dec. 1, 2022

(30) Foreign Application Priority Data

May 31, 2021 (CN) .......................... 202110600293.7

(51) Int. Cl.
| | |
|---|---|
| H01L 29/66 | (2006.01) |
| H01L 21/02 | (2006.01) |
| H10D 64/01 | (2025.01) |
| H10D 84/01 | (2025.01) |
| H10D 84/03 | (2025.01) |

(52) U.S. Cl.
CPC ..... *H10D 64/017* (2025.01); *H01L 21/02167* (2013.01); *H01L 21/0217* (2013.01); *H01L 21/0228* (2013.01); *H10D 84/013* (2025.01); *H10D 84/0158* (2025.01); *H10D 84/038* (2025.01)

(58) Field of Classification Search
CPC ....... H01L 21/823431; H01L 29/66795; H01L 29/785; H01L 27/0924; H01L 21/823821
See application file for complete search history.

(56) References Cited

U.S. PATENT DOCUMENTS

| | | | |
|---|---|---|---|
| 10,050,146 B2 | 8/2018 | Lu et al. | |
| 2005/0020020 A1* | 1/2005 | Collaert | H01L 29/785 |
| | | | 438/303 |
| 2015/0221749 A1* | 8/2015 | Xie | H01L 29/518 |
| | | | 257/410 |

(Continued)

FOREIGN PATENT DOCUMENTS

CN 105322013 A 2/2016

OTHER PUBLICATIONS

First Search Report Mailed on Jan. 9, 2024 for CN Application No. 2021106002937, 4 page(s).

*Primary Examiner* — Walter H Swanson
(74) *Attorney, Agent, or Firm* — Banner & Witcoff, Ltd.

(57) ABSTRACT

The present application provides a method for manufacturing a metal gate, comprising: step 1: forming a polysilicon dummy gate on a semiconductor substrate; step 2: forming low dielectric constant sidewalls, comprising: step 21: forming a first protective layer; step 22: forming a second low dielectric constant layer; step 23: forming a third protective layer; and step 24: performing blank etching, and forming the low dielectric constant sidewalls by stacking the first protective layer, the second low dielectric constant layer, and the third protective layer on the side surfaces of the polysilicon dummy gate; step 3: forming a zeroth interlayer film; and step 4: performing gate replacement, comprising: step 41: removing the polysilicon dummy gate, and forming a gate trench; and step 42: forming a metal gate in the gate trench.

12 Claims, 7 Drawing Sheets

(56) References Cited

U.S. PATENT DOCUMENTS

2016/0020110 A1\* 1/2016 Lu .......................... H01L 29/78
                                                        257/618
2017/0221893 A1\* 8/2017 Tak ................. H01L 21/823481

\* cited by examiner

METHOD FOR MANUFACTURING METAL GATE

CROSS-REFERENCES TO RELATED APPLICATIONS

This application claims the priority to Chinese patent application No. CN 202110600293.7, filed on May 31, 2021, and entitled "METHOD FOR MANUFACTURING METAL GATE", the disclosure of which is incorporated herein by reference in entirety.

TECHNICAL FIELD

The present application relates to the field of semiconductor integrated circuit manufacturing, in particular, to a method for manufacturing a metal gate (MG).

BACKGROUND

In manufacturing semiconductor integrated circuits for technology nodes earlier than 28 nm, the parasitic capacitances between the source-drain contacts and the gate are often ignored because of the relatively large spaces between each gate and the source-drain contacts, i.e., the contact (CT) of the source region or drain region. As the scale of integrated circuits continues to shrink, the size of each unit component has become increasingly smaller. At technology nodes below 14 nm, the spaces between the source-drain contacts and the gate decrease even faster, and the strip structures of the source-drain contacts result in the increase in the physical area for the parasitic capacitance. Under the combined influence of the two factors, the parasitic capacitance between the source-drain contacts and the gate will increase, which cannot be ignored.

Referring to FIGS. 1A-1G, which are cross sectional views of device structures in steps of manufacturing a metal gate with an existing method, which includes the following steps:

Step 1. Referring to FIG. 1A, a semiconductor substrate 101 is provided, and a plurality of polysilicon dummy gates 102 are formed on the semiconductor substrate 101, here only one of the gates 102 is shown in the figures, wherein there is a spacer region between two polysilicon dummy gates 102, and a first gate dielectric layer is formed between the polysilicon dummy gate 102 and the semiconductor substrate 101.

A hard mask layer 103 is formed on top of the polysilicon dummy gate 102. The hard mask layer 103 is formed by stacking a first hard mask layer 103a and a second hard mask layer 103b. The material of the first hard mask layer 103a typically includes silicon oxide, and the material of the second hard mask layer 103b typically includes silicon nitride. In the process of patterning the polysilicon dummy gate 102, the hard mask layer 103 is etched first, and then polysilicon is etched using the hard mask layer 103 as a mask to form the polysilicon dummy gate 102.

Step 2 Low dielectric constant sidewalls 104 are formed on the side surfaces of the polysilicon dummy gate 102, this step includes the following sub-steps:

Step 21. Referring to FIG. 1B, a SiOCN film is grown by means of an ALD process and a low dielectric constant layer 104a is formed.

Step 22. Referring to FIG. 1C, the low dielectric constant layer 104a is fully etched, and the low dielectric constant sidewalls 104 are formed on the side surfaces surfaces of the polysilicon dummy gate 102. Since a SiOCN film is not etching-resistant, a loss of the SiOCN film easily occurs in the etching process corresponding to FIG. 1C.

Referring to FIG. 1C, the method further includes a step of forming a source region 105a and a drain region 105b of the semiconductor device in the semiconductor substrate 101 on both sides of the polysilicon dummy gate 102.

Step 3. Referring to FIG. 1D, a contact etch stop layer 106 is formed, wherein the contact etch stop layer 106 covers the surfaces of the low dielectric constant sidewalls 104, the top surface of the polysilicon dummy gate 102, and the surface of the semiconductor substrate 101 outside the polysilicon dummy gate 102. The contact etch stop layer 106 is usually formed by a SiN material.

A process of depositing a zeroth interlayer film 107 is performed, wherein the deposited zeroth interlayer film 107 fills the spacer region and extends to the top of the polysilicon dummy gate 102 outside the spacer region. The zeroth interlayer film 107 is usually formed by silicon oxide.

The above steps usually include conventional processes such as pickling and thermal oxidation, which cause a further loss of the SiOCN film, thereby further reducing the thickness of the low dielectric constant sidewall 104.

Referring to FIG. 1E, a chemical mechanical polishing (CMP) process is performed to remove the contact etch stop layer 106 and the zeroth interlayer film 107 from the top surface of the polysilicon dummy gate 102 and to make the top surface of the zeroth interlayer film 107 in the spacer region flush with the top surface of the polysilicon dummy gate 102. The chemical mechanical polishing process causes a further loss of the SiOCN film, thereby further reducing the thickness of the low dielectric constant sidewalls 104.

Step 4: Gate replacement is performed, including the following sub-steps:

Step 41. Referring to FIG. 1F, the polysilicon dummy gate 102 is removed, and a gate trench 108 is formed in a region from which the polysilicon dummy gate 102 is removed. The process of etching the polysilicon dummy gate 102 causes a further loss of the low dielectric constant sidewalls 104, and the low dielectric constant sidewalls 104 in some regions may even be completely removed. FIG. 1F illustrates a cross sectional view of a location where the low dielectric constant sidewalls 104 are completely removed. The dashed line box 108a indicates the where the region of the polysilicon dummy gate 102 should be. If there is no loss of the low dielectric constant sidewalls 104, the gate trench 108 is located in the dashed line box 108a. Therefore, as the result of the loss of the low dielectric constant sidewalls 104, the gate trench 108 will be enlarged.

Step 42. Referring to FIG. 1G, a metal gate is formed in the gate trench 108 (in FIG. 1F).

The process of forming the metal gate includes the following:

a metal work function layer 109 is formed; and
a metal conductive material layer 110 is formed.

The material of the metal conductive material layer 110 includes tungsten.

The material of the metal work function layer 109 of an NMOS device includes TiAl.

The material of the metal work function layer 109 of a PMOS device includes TiN.

The method further includes a step of forming contacts 111 on the top surfaces of the metal gate, the source region 105a, and the drain region 105b after step 4. From FIG. 1G, as the width of the metal gate is enlarged, the space between the metal gate and the contact 111 on top of the source region 105a or the contact 111 on top of the drain region 105b becomes smaller, in which case the short circuit may occur therebetween.

BRIEF SUMMARY

The technical problem to be solved by the present application is to provide a method for manufacturing a metal gate, which can achieve a low dielectric constant sidewalls while avoiding a loss of the low dielectric constant sidewalls in the process, thereby avoiding gate enlargement and avoiding the short circuit between a source/drain contact and the gate.

The method for manufacturing a metal gate provided by the present application comprises the following steps:

step 1: providing a semiconductor substrate, and forming a plurality of polysilicon dummy gates on the semiconductor substrate, wherein there is a spacer region between the polysilicon dummy gates, and a first gate dielectric layer is formed between the polysilicon dummy gate and the semiconductor substrate;

step 2: forming low dielectric constant sidewalls on the side surfaces of the polysilicon dummy gate, comprising the following sub-steps:

step 21: forming a first protective layer, wherein the first protective layer covers the side surfaces and top surface of the polysilicon dummy gate and the surface of the semiconductor substrate outside the polysilicon dummy gate, and the thermal stability and etching resistance of the first protective layer are higher than the thermal stability and etching resistance of a second low dielectric constant layer formed subsequently;

step 22: forming the second low dielectric constant layer, wherein the second low dielectric constant layer is formed on the surface of the first protective layer;

step 23: forming a third protective layer, wherein the third protective layer is formed on the surface of the second low dielectric constant layer, and the thermal stability and etching resistance of the third protective layer are higher than the thermal stability and etching resistance of the second low dielectric constant layer; and step 24: fully etching a stack layer of the first protective layer, the second low dielectric constant layer, and the third protective layer, and forming the low dielectric constant sidewalls by stacking the first protective layer, the second low dielectric constant layer, and the third protective layer on the side surfaces of the polysilicon dummy gate, wherein the first protective layer, the second low dielectric constant layer, and the third protective layer on the top surface of the polysilicon dummy gate and on the surface of the semiconductor substrate outside the low dielectric constant sidewalls are all removed;

step 3: forming a zeroth interlayer film in the spacer region; and step 4: performing gate replacement, comprising the following sub-steps:

step 41: removing the polysilicon dummy gate, and forming a gate trench from where the polysilicon dummy gate is removed; and step 42: forming a metal gate in the gate trench.

In a further improvement, the material of the second low dielectric constant layer is SiOCN.

In a further improvement, the material of the first protective layer is silicon carbon nitride (SiCN).

In a further improvement, the material of the third protective layer is SiCN.

In a further improvement, the second low dielectric constant layer is grown by means of an ALD process in step 22.

In a further improvement, the first protective layer is grown by means of the ALD process in step 21; and the first protective layer is grown by means of the ALD process in step 23.

Continuous growth in the same ALD process chamber is implemented in step 21, step 22, and step 23.

In a further improvement, the semiconductor substrate comprises a silicon substrate.

In a further improvement, the method further comprises a step of forming a source region and a drain region of a semiconductor device in the semiconductor substrate on both sides of the polysilicon dummy gate after step 2 and before step 3.

In a further improvement, the semiconductor device is a FinFET; a fin is formed on the semiconductor substrate in step 1, the fin formed by etching the semiconductor substrate; and the polysilicon dummy gate covers the top surface and the side surfaces of the fin.

In a further improvement, a hard mask layer is formed on the top of the polysilicon dummy gate in step 1; and the first protective layer covers the surface of the hard mask layer in step 21.

In a further improvement, the method further comprises the following step before forming the zeroth interlayer film in step 3:

forming a contact etch stop layer, wherein the contact etch stop layer covers the side surfaces of the low dielectric constant sidewalls, the top surface of the polysilicon dummy gate, and the surface of the semiconductor substrate outside the polysilicon dummy gate.

In a further improvement, the step of forming the zeroth interlayer film in step 3 comprises:

performing a process of depositing the zeroth interlayer film, wherein the deposited zeroth interlayer film fills the spacer region and extends to the top of the polysilicon dummy gate outside the spacer region; and performing a chemical mechanical polishing process to remove the contact etch stop layer and the zeroth interlayer film on the top of the polysilicon dummy gate and to make the top surface of the zeroth interlayer film in the spacer region flush with the top surface of the polysilicon dummy gate.

In a further improvement, the first gate dielectric layer comprises a high dielectric constant layer, the first gate dielectric layer is remained in step 41, and a gate structure is formed by stacking the first gate dielectric layer and the metal gate after step 42 is completed; or the first gate dielectric layer is removed in step 41, the method further comprises a step of forming a second gate dielectric layer before forming the metal gate, the second gate dielectric layer comprises a high dielectric constant layer, and a gate structure is formed by stacking the second gate dielectric layer and the metal gate after step 42 is completed.

In a further improvement, the process of forming the metal gate in step 42 comprises:

forming a metal work function layer; and forming a metal conductive material layer.

In a further improvement, the material of the metal conductive material layer comprises tungsten;

the material of the metal work function layer of an NMOS device comprises TiAl; and the material of the metal work function layer of a PMOS device comprises TiN.

In a further improvement, the method further comprises a step of forming contacts on the tops of the metal gate, the source region, and the drain region after step 4.

In the present application, during the process of forming the low dielectric constant sidewalls, the low dielectric constant sidewalls is not formed by directly depositing a low dielectric constant layer and then performing blank etching, but is formed by sequentially forming the first protective layer, the second low dielectric constant layer, and the third protective layer and then performing blank etching, so that the first protective layer and the third protective layer respectively protect the inner side and the outer side of the second low dielectric constant layer, in which case the sidewalls has the properties of a low dielectric constant, antioxidation, and anti-etching. The third protective layer can fill the spacer region before the gate replacement process, avoiding a loss on the outside of the second low dielectric constant layer resulting from the factors such as pickling, etching, or thermal oxidation. The first protective layer can prevent the second low dielectric constant layer from being etched from the inside during the process of removing the polysilicon dummy gate. Therefore, the present application can achieve the low dielectric constant sidewalls, thus reducing the parasitic capacitance between the source/drain contact and the gate, while avoiding a loss of the low dielectric constant sidewalls in the process, thereby avoiding gate enlargement and avoiding the short circuit between the source/drain contact and the gate.

BRIEF DESCRIPTION OF THE DRAWINGS

The present application is further described in detail below with reference to the drawings and specific embodiments.

DETAILED DESCRIPTION

Figure 1A:
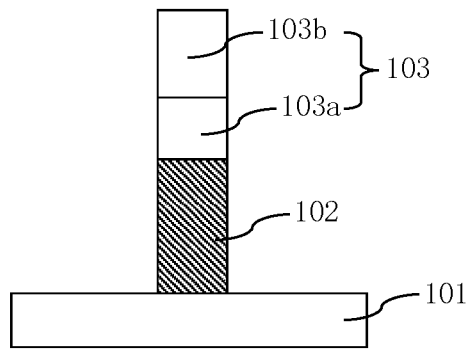
FIG. 1A to FIG. 1G are cross sectional views of device structures in steps of manufacturing a metal gate with the existing method
Figure 1B:
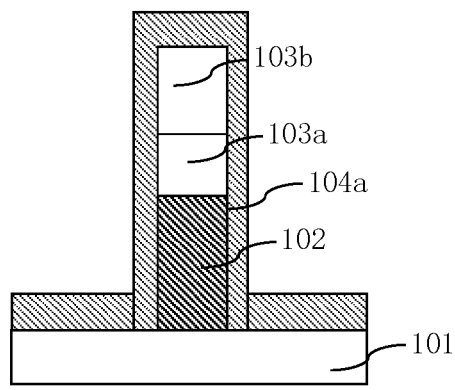
Figure 1C:
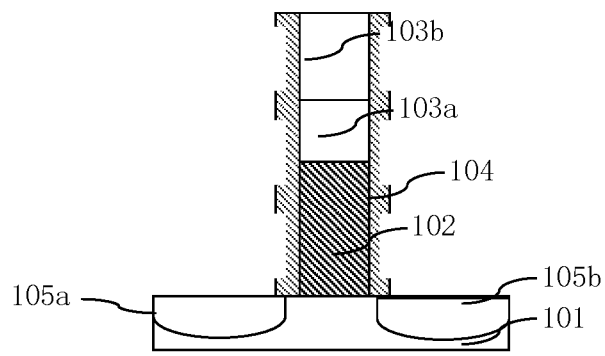
Figure 1D:
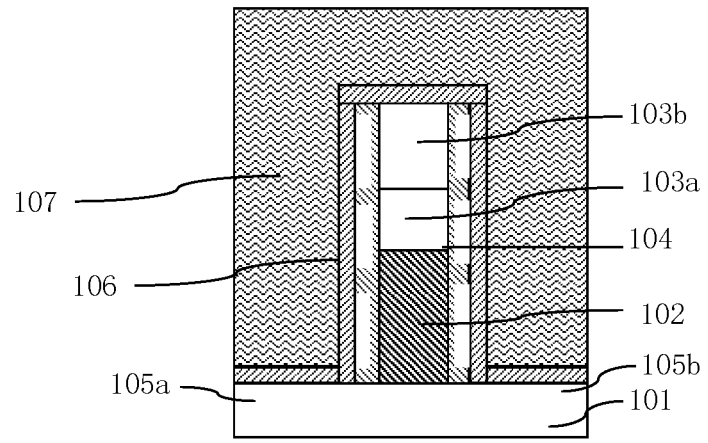
Figure 1E:
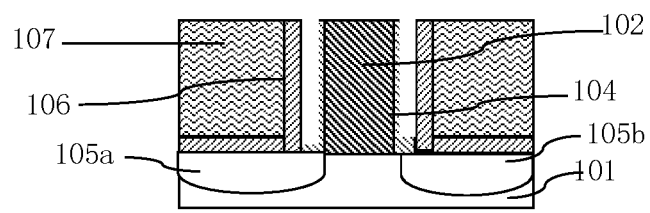
Figure 1F:
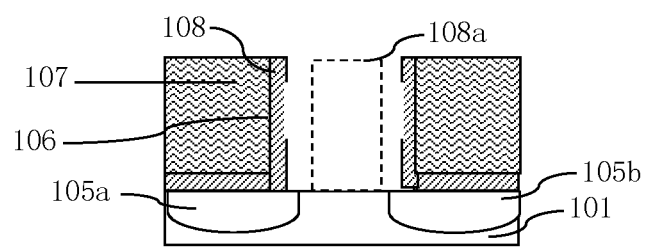
Figure 1G:
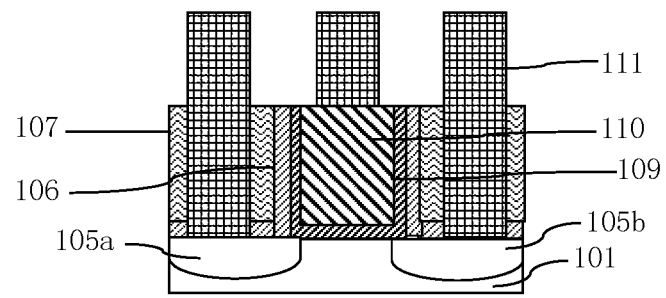
Figure 2:
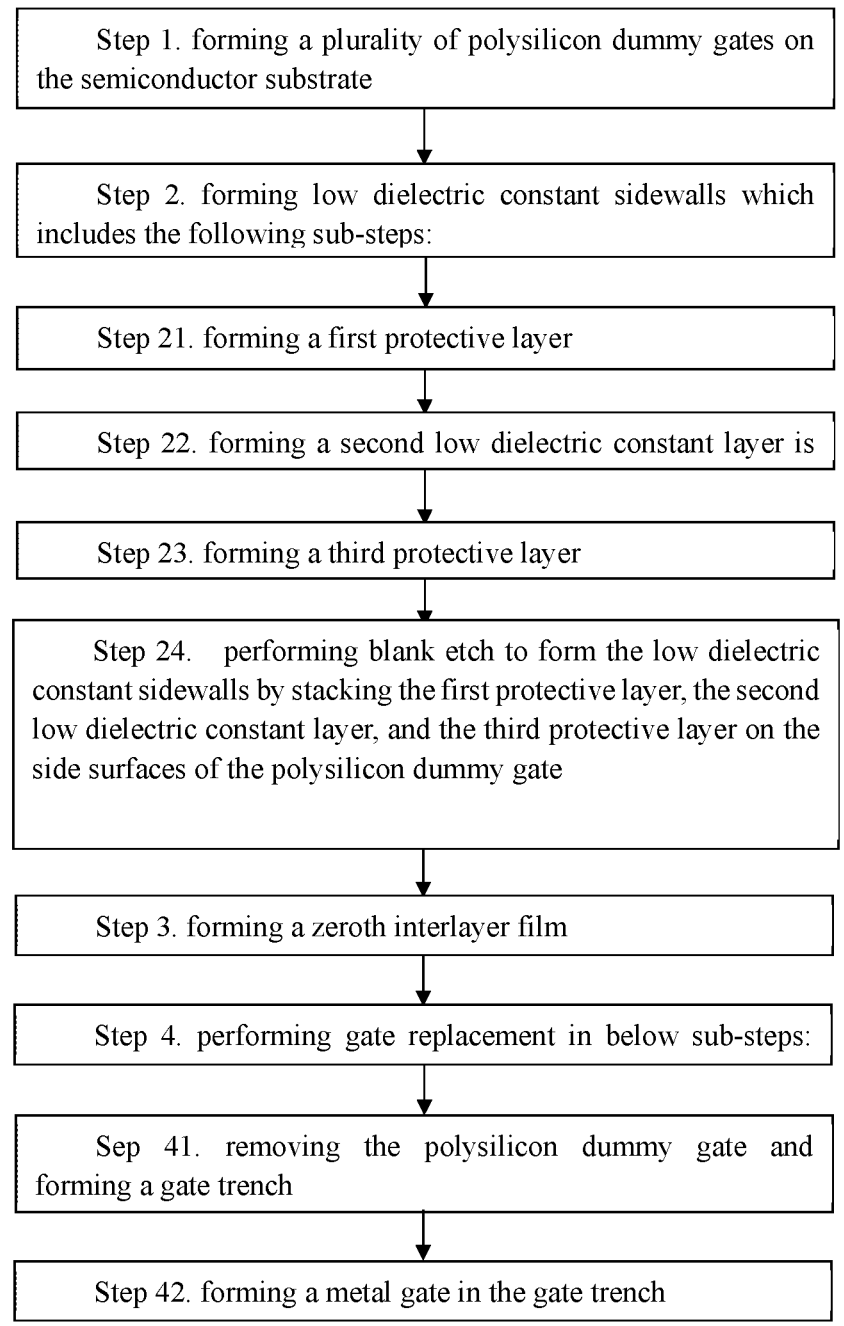
FIG. 2 is a flowchart of a method for manufacturing a metal gate according to an embodiment of the present application.
Figure 3A:
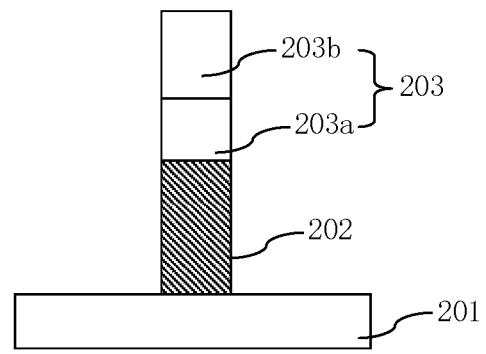
FIG. 3A to FIG. 3H are cross sectional views of device structures in steps of manufacturing a metal gate with the method according to an embodiment of the present application.

FIG. 2 is a flowchart of the method for manufacturing a metal gate according to an embodiment of the present application. FIG. 3A to FIG. 3H are cross sectional views of device structures in steps of manufacturing a metal gate according to an embodiment of the present application. The method for manufacturing a metal gate with the method according to the embodiment of the present application includes the following steps:

Step 1. Referring to FIG. 3A, a semiconductor substrate 201 is provided, and a plurality of polysilicon dummy gates 202 are formed on the semiconductor substrate 201, wherein there is a spacer region between the polysilicon dummy gates 202, and a first gate dielectric layer is formed between the polysilicon dummy gate 202 and the semiconductor substrate 201.

In the embodiment of the present application, the semiconductor substrate 201 includes a silicon substrate.

A hard mask layer 203 is formed on top of the polysilicon dummy gate 202. The hard mask layer 203 is formed by stacking a first hard mask layer 203a and a second hard mask layer 203b. The material of the first hard mask layer 203a includes silicon oxide, and the material of the second hard mask layer 203b includes silicon nitride. In the process of patterning the polysilicon dummy gate 202, the hard mask layer 203 is etched first, and then polysilicon is etched using the hard mask layer 203 as a mask to form the polysilicon dummy gate 202.

Figure 3B:
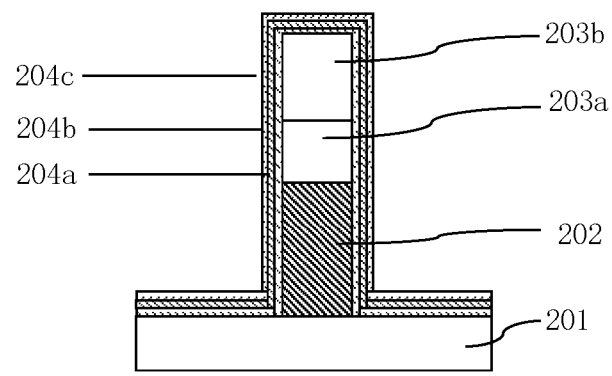

Step 2. The low dielectric constant sidewalls 204 are formed on the side surfaces of the polysilicon dummy gate 202, including the following sub-steps:

Step 21. Referring to FIG. 3B, a first protective layer 204a is formed, wherein the first protective layer 204a covers the side surfaces and top surface of the polysilicon dummy gate 202 and the surface of the semiconductor substrate 201 outside the polysilicon dummy gate 202, and the thermal stability and etching resistance of the first protective layer 204a are higher than the thermal stability and etching resistance of a second low dielectric constant layer 204b formed subsequently.

Since the hard mask layer 203 is formed on the top surface of the polysilicon dummy gate 202, the first protective layer 204a also covers the side surfaces and top surface of the hard mask layer 203.

Step 22. Referring to FIG. 3B, the second low dielectric constant layer 204b is formed, wherein the second low dielectric constant layer 204b is formed on the surface of the first protective layer 204a.

Step 23. Referring to FIG. 3B, a third protective layer 204c is formed, wherein the third protective layer 204c is formed on the surface of the second low dielectric constant layer 204b, and the thermal stability and etching resistance of the third protective layer 204c are higher than the thermal stability and etching resistance of the second low dielectric constant layer 204b.

In the embodiment of the present application, the material of the second low dielectric constant layer 204b is SiOCN.

The material of the first protective layer 204a is SiCN.

The material of the third protective layer 204c is also SiCN.

The second low dielectric constant layer 204b is grown by means of an ALD process in step 22.

The first protective layer 204a is grown by means of the ALD process in step 21; and the first protective layer 204a is grown by means of the ALD process in step 23.

Continuous growth in the same ALD process chamber is implemented in step 21, step 22, and step 23. The first protective layer 204a, the second low dielectric constant layer 204b, and the third protective layer 204c can be realized by means of gradient film growth, i.e., realized by designing three process sequences in similar ALD growth process.

Figure 3C:
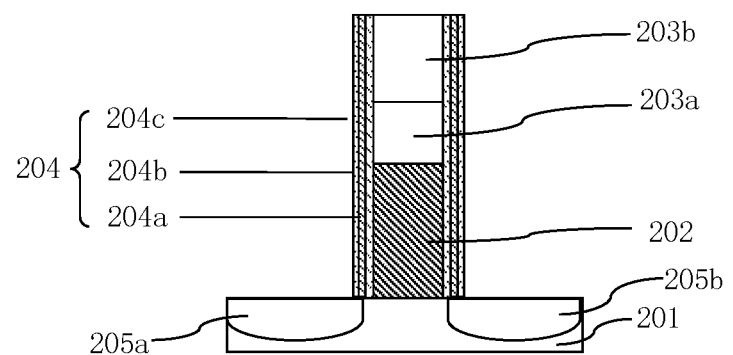

Step 24. Referring to FIG. 3C, a stack layer combining the first protective layer 204a, the second low dielectric constant layer 204b, and the third protective layer 204c are fully etched, and the low dielectric constant sidewalls 204 are formed by stacking the first protective layer 204a, the second low dielectric constant layer 204b, and the third protective layer 204c on the side surfaces of the polysilicon dummy gate 202, wherein the first protective layer 204a, the second low dielectric constant layer 204b, and the third protective layer 204c on the top surface of the polysilicon dummy gate 202 and on the surface of the semiconductor substrate 201 outside the low dielectric constant sidewalls 204 are all removed.

Referring to FIG. 3C, the method further includes a step of forming a source region 205a and a drain region 205b of a semiconductor device in the semiconductor substrate 201 on both sides of the polysilicon dummy gate 202.

As the process node progresses, for example, when the process node reaches to and beyond 14 nm, FinFETs are replacing the semiconductor devices; in FinFETS, fins are formed by etching on the semiconductor substrate 201 in step 1, and the polysilicon dummy gate 202 are made the top surface and the side surfaces of the fin.

Figure 3D:
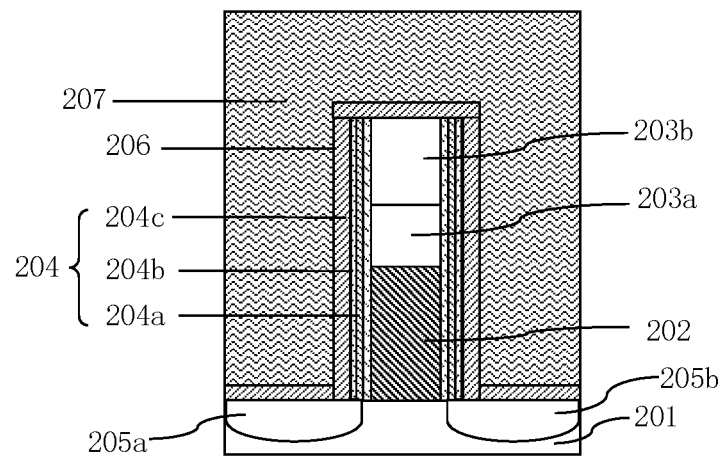

Step 3. Referring to FIG. 3D, a zeroth interlayer film 207 is formed in the spacer region.

In the embodiment of the present application, the method further includes the following step before forming the zeroth interlayer film 207:

A contact etch stop layer 206 is formed, wherein the contact etch stop layer 206 covers the side surfaces of the low dielectric constant sidewalls 204, the top surface of the polysilicon dummy gate 202, and the surface of the semiconductor substrate 201 outside the polysilicon dummy gate 202.

The step of forming the zeroth interlayer film 207 includes the following processes:

A process of depositing the zeroth interlayer film 207 is performed, wherein the deposited zeroth interlayer film 207 fills the spacer region and extends to the top of the polysilicon dummy gate 202 outside the spacer region.

Figure 3E:
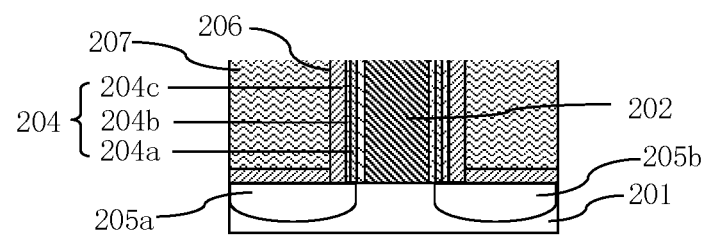

Referring to FIG. 3E, a chemical mechanical polishing process is performed to remove the contact etch stop layer 206 and the zeroth interlayer film 207 on top of the polysilicon dummy gate 202 and to make the top surface of the zeroth interlayer film 207 in the spacer region flush with the top surface of the polysilicon dummy gate 202.

Figure 3F:
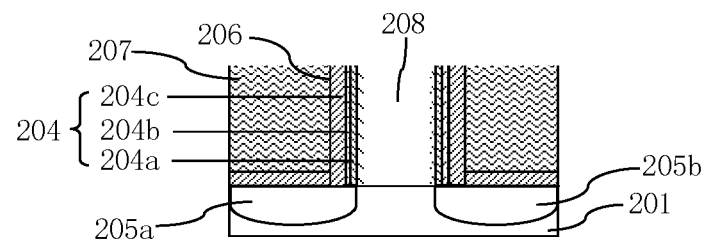
Figure 3G:
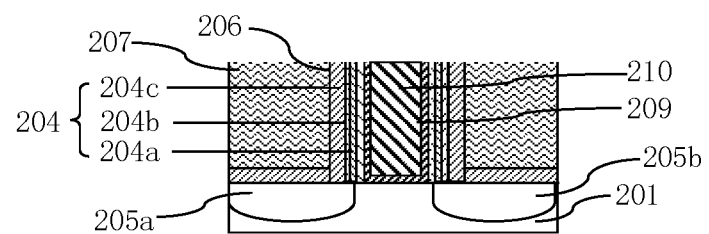
Figure 3H:
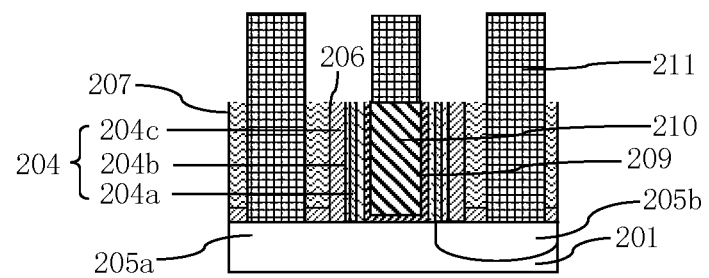

Step 4. Gate replacement is performed, including the following sub-steps:

Step 41. Referring to FIG. 3F, the polysilicon dummy gate 202 is removed, and a gate trench 208 in a region from which the polysilicon dummy gate 202 is removed is formed. In the process of removing the polysilicon dummy gate 202, the first protective layer 204a prevents the second low dielectric constant layer 204b from being etched.

In the embodiment of the present application, the first gate dielectric layer includes a high dielectric constant layer, the first gate dielectric layer is remained in step 41, and a gate structure is formed by stacking the first gate dielectric layer and the metal gate after step 42 is completed. In other embodiments, the first gate dielectric layer is removed in step 41, the method further includes a step of forming a second gate dielectric layer before forming the metal gate, the second gate dielectric layer includes a high dielectric constant layer, and a gate structure is formed by stacking the second gate dielectric layer and the metal gate after step 42 is completed.

Step 42. A metal gate is formed in the gate trench 208.

The process of forming the metal gate includes the following sub-steps:

A metal work function layer 209 is formed.

A metal conductive material layer is formed.

The material of the metal conductive material layer 210 includes tungsten.

The material of the metal work function layer 209 of an NMOS device includes TiAl.

The material of the metal work function layer 209 of a PMOS device includes TiN.

The method further includes a step of forming contacts on the tops of the metal gate, the source region 205a, and the drain region 205b after step 4.

Step 2 of the embodiment of the present application is implemented by means of the gradient film growth. The three sequences are designed in the ALD process. First, in the first sequence, a SiCN film, i.e., the first protective layer 204a, is grown on the sidewalls close to the polysilicon dummy gate 202, and since SiCN has an ultra-low etching rate, it can be ensured that the SiCN film is not etched away during the process of removing the polysilicon dummy gate 202. In the second sequence, a SiOCN film, i.e., the second low dielectric constant layer 204b, is grown on the basis of the SiCN film in the first sequence, to ensure the low-k characteristic of the sidewalls. In the third sequence, on the basis of the above two sequences, a SiCN film, i.e., the third protective layer 204c, is grown on the outermost layer of the sidewalls of the polysilicon dummy gate 202, wherein the good thermal stability and etching resistance of SiCN ensure that, during the process of manufacturing the metal gate after the sidewalls are grown, there is no loss of the sidewalls resulting from the factors such as pickling, etching, and thermal oxidation. For example, in the etching process of step 24 and the process steps of forming the contact etching stop layer 206 and the zeroth interlayer film 207 in step 3, conventional process steps such as pickling, etching, and thermal oxidation are usually adopted. In these steps, since the third protective layer 204c covers the outer surface of the second low dielectric constant layer 204b, a loss on the outside of the second low dielectric constant layer 204b resulting from these processes can be avoided. The thickness of the gradient film growth mode is controllable, thus ensuring the low-k characteristic of the sidewalls while avoiding gate enlargement due to the loss of the sidewalls, and thereby avoiding the short circuit between the source/drain contact and the gate caused by the gate enlargement.

In the embodiment of the present application, during the process of forming the low dielectric constant sidewalls 204, the low dielectric constant sidewalls 204 are not formed by directly depositing a low dielectric constant layer and then performing blank etching, but is formed by sequentially forming the first protective layer 204a, the second low dielectric constant layer 204b, and the third protective layer 204c and then performing blank etching, so that the first protective layer 204a and the third protective layer 204c respectively protect the inner side and the outer side of the second low dielectric constant layer 204b, in which case the sidewalls have the properties of a low dielectric constant, antioxidation, and anti-etching. The third protective layer 204c can fill the spacer region before the gate replacement process, avoiding a loss on the outside of the second low dielectric constant layer 204b resulting from the factors such as pickling, etching, or thermal oxidation. The first protective layer 204a can prevent the second low dielectric constant layer 204b from being etched from the inside during the process of removing the polysilicon dummy gate 202. Therefore, the embodiment of the present application can achieve the low dielectric constant sidewalls 204, thus reducing the parasitic capacitance between the source/drain contact 211 and the gate, while avoiding a loss of the low dielectric constant sidewalls 204 in the process, thereby avoiding gate enlargement and avoiding the short circuit between the source/drain contact 211 and the gate.

The present application is described above in detail via specific embodiments, but these embodiments do not intended to limit the present application. Without departing from the principle of the present application, those skilled in the art can make many modifications and improvements, which shall also be regarded as the protection scope of the present application.

What is claimed is:

1. A method for manufacturing a metal gate of a semiconductor device, comprising the following steps:
step 1: providing a semiconductor substrate, forming a polysilicon dummy gate on the semiconductor substrate, wherein a spacer region is configured to be around the polysilicon dummy gate, forming a first gate dielectric layer between the polysilicon dummy gate and a surface of the semiconductor substrate, forming a first hard mask layer on a top surface of the polysilicon dummy gate, and forming a second hard mask layer on a top surface of the first hard mask layer;
step 2: forming a low dielectric constant sidewall layer on side surfaces of the second hard mask layer, the first hard mask layer, and the polysilicon dummy gate, wherein the step 2 comprises the following sub-steps:
step 21: forming a first protective layer, wherein the first protective layer is disposed on a top surface and the side surfaces of the second hard mask layer, on the side surfaces of the first hard mask layer, and on the side surfaces of the polysilicon dummy gate, wherein the first protective layer is also disposed on a portion of the surface of the semiconductor substrate not under the polysilicon dummy gate;
step 22: forming a second low dielectric constant layer on an outer surface of the first protective layer, wherein the first protective layer has a higher thermal stability and a higher etching resistance than a thermal stability and an etching resistance of the second low dielectric constant layer;
step 23: forming a third protective layer on an outer surface of the second low dielectric constant layer, wherein a thermal stability and an etching resistance of the third protective layer are higher than the thermal stability and etching resistance of the second low dielectric constant layer,
wherein the first protective layer, the second low dielectric constant layer, and the third protective layer combine to constitute the low dielectric constant sidewall layer in the spacer region at sides of the polysilicon dummy gate;
step 24: removing by etching the low dielectric constant sidewall layer from the top surface of the second hard mask layer, and from a part of the portion of the surface of the semiconductor substrate not under the low dielectric constant sidewall layer, in the spacer region;
step 3: forming a contact etch stop layer on the top surface of the second hard mask layer, on sides of the remaining low dielectric constant sidewall layer, and on the part of the portion of the surface of the semiconductor substrate not under the polysilicon dummy gate;
forming a zeroth interlayer film on a top surface of the contact etch stop layer in the spacer region, and removing, by polishing, the zeroth interlayer film and the contact etch stop layer on the first and second hard mask layers, and the contact etch stop layer on a part of the low dielectric constant sidewall layer to be flush with the top surface of the polysilicon dummy gate, wherein a top surface of the zeroth interlayer film in the spacer region is flush with the top surface of the polysilicon dummy gate; and
step 4: performing gate replacement, wherein the step 4 comprises the following sub-steps:
step 41: removing the polysilicon dummy gate, and forming a gate trench from where the polysilicon dummy gate is removed; and
step 42: forming the metal gate in the gate trench.

2. The method for manufacturing the metal gate according to claim 1, wherein a material of the second low dielectric constant layer is SiOCN.

3. The method for manufacturing the metal gate according to claim 2, wherein a material of the first protective layer is SiCN.

4. The method for manufacturing the metal gate according to claim 3, wherein a material of the third protective layer is SiCN.

5. The method for manufacturing the metal gate according to claim 4, wherein the second low dielectric constant layer is grown by means of an ALD process in step 22.

6. The method for manufacturing the metal gate according to claim 5, wherein the first protective layer is grown by means of the ALD process in step 21; wherein the third protective layer is grown by means of the ALD process in step 23; and
wherein a continuous growth in a same ALD process chamber is implemented in step 21, step 22, and step 23.

7. The method for manufacturing the metal gate according to claim 1, wherein the semiconductor substrate comprises a silicon substrate.

8. The method for manufacturing the metal gate according to claim 7, further comprising a step of forming a source region and a drain region on both sides of the polysilicon dummy gate after step 2 and before step 3.

9. The method for manufacturing the metal gate according to claim 8, further comprising a step of forming contacts on top surfaces of the metal gate, the source region, and the drain region after step 4.

10. The method for manufacturing the metal gate according to claim 1, wherein the first gate dielectric layer comprises a high dielectric constant layer, wherein step 41 does not remove the first gate dielectric layer, and wherein step 42 forms a gate structure by stacking the first gate dielectric layer and the metal gate; or
wherein step 41 removes the first gate dielectric layer, wherein the method further comprises a step of forming a second gate dielectric layer before forming the metal gate, wherein the second gate dielectric layer comprises a high dielectric constant layer, and
wherein step 42 forms the gate structure by stacking the second gate dielectric layer and the metal gate.

11. The method for manufacturing the metal gate according to claim 10, wherein the forming the metal gate in the gate trench in step 42 further comprises:
forming a metal work function layer; and
forming a metal conductive material layer.

12. The method for manufacturing the metal gate according to claim 11, wherein a material of the metal conductive material layer comprises tungsten;
wherein a material of the metal work function layer of an NMOS device comprises TiAl; and
wherein a material of the metal work function layer of a PMOS device comprises TiN.

* * * * *